(12) United States Patent
Schoessow

(10) Patent No.: US 11,935,735 B2
(45) Date of Patent: Mar. 19, 2024

(54) COUPLED-AMPLIFIER MULTI-FREQUENCY CIRCUIT TOPOLOGIES APPLICABLE TO MASS SPECTROMETER RADIO-FREQUENCY DRIVE SYSTEMS

(71) Applicant: AGILENT TECHNOLOGIES, INC., Santa Clara, CA (US)

(72) Inventor: Michael J. Schoessow, Santa Clara, CA (US)

(73) Assignee: AGILENT TECHNOLOGIES, INC., Santa Clara, CA (US)

( * ) Notice: Subject to any disclaimer, the term of this patent is extended or adjusted under 35 U.S.C. 154(b) by 93 days.

(21) Appl. No.: 17/867,594

(22) Filed: Jul. 18, 2022

(65) Prior Publication Data
US 2022/0360286 A1 Nov. 10, 2022

Related U.S. Application Data

(63) Continuation of application No. 16/926,357, filed on Jul. 10, 2020, now Pat. No. 11,418,228.

(60) Provisional application No. 62/873,321, filed on Jul. 12, 2019.

(51) Int. Cl.
| | |
|---|---|
| *H01J 49/42* | (2006.01) |
| *H01J 49/02* | (2006.01) |
| *H01J 49/26* | (2006.01) |
| *H01J 49/40* | (2006.01) |
| *H03H 7/46* | (2006.01) |

(52) U.S. Cl.
CPC ........ *H01J 49/4285* (2013.01); *H01J 49/022* (2013.01); *H01J 49/26* (2013.01); *H01J 49/40* (2013.01); *H01J 49/4225* (2013.01); *H01J 49/4235* (2013.01); *H03H 7/46* (2013.01)

(58) Field of Classification Search
CPC ...... H04B 1/1607; H04B 1/18; H04B 10/693; H01J 49/022; H01J 49/26; H01J 49/40; H01J 49/4225; H01J 49/4235; H01J 49/42; H01J 49/4285; H03H 7/0115; H03H 7/1766; H03H 7/46; H03H 2001/0085; H03H 2007/013; H03F 1/565; H03F 3/19; H03F 3/211; H03F 2200/111; H03F 2200/391; H03F 2200/451
USPC ................................................ 250/281, 282
See application file for complete search history.

(56) References Cited

U.S. PATENT DOCUMENTS

| | | | |
|---|---|---|---|
| 2015/0381057 A1 | 12/2015 | Luu | |
| 2020/0136555 A1* | 4/2020 | Schoessow | ............... H03F 3/21 |
| 2020/0328070 A1* | 10/2020 | Schoessow | ........... H01J 49/022 |

* cited by examiner

*Primary Examiner* — Kiet T Nguyen
(74) *Attorney, Agent, or Firm* — Mannava & Kang, P.C.

(57) ABSTRACT

A circuit and method for providing high-voltage radio-frequency (RF) energy to an instrument at multiple frequencies includes a plurality of inputs each configured to receive an RF voltage signal oscillating at a corresponding frequency, and a step-up circuit for generating magnified RF voltage signals based on the received RF voltage signals. The step-up circuit includes an LC network operable to isolate the RF voltage signals at the plurality inputs from one another while preserving a voltage magnification from each input to a common output at each of the corresponding frequencies.

20 Claims, 6 Drawing Sheets

US 11,935,735 B2

COUPLED-AMPLIFIER MULTI-FREQUENCY CIRCUIT TOPOLOGIES APPLICABLE TO MASS SPECTROMETER RADIO-FREQUENCY DRIVE SYSTEMS

PRIORITY

This application is a Continuation of commonly assigned and co-pending U.S. patent application Ser. No. 16/926,357, filed Jul. 10, 2020, which claims priority from U.S. Provisional Pat. App. No. 62/873,321, filed on Jul. 12, 2019, and claims the benefit under 35 U.S.C. § and 119 and 120 and 37 CFR1.78(a) of the filing dates of these applications, the contents of which are incorporated herein by reference in their entireties.

TECHNICAL FIELD

The present disclosure relates generally to radio-frequency power generation for instruments such as mass spectrometers.

BACKGROUND

Many instruments, such as mass spectrometers, require a source of high-voltage radio-frequency energy to apply to various ion-manipulating structures, including but not limited to multi-rod assemblies (quadrupole, hexapole, octupole or other) or stacked ring electrodes within a vacuum manifold. These high-voltage RF voltage sources are typically produced with resonant LC (inductor-capacitor) networks configured to step up the output voltage of RF power amplifiers. The amplifiers are fed signals from oscillators or synthesizers operating at the resonant frequencies of the LC step-up networks.

The choices of frequencies typically involve compromises between various performance attributes, and each rod assembly generally receives a voltage waveform at a single operating frequency. The choice of operating frequency in a mass spectrometer involves trade-offs; a higher frequency yields higher mass resolution while a lower frequency yields better sensitivity for a given RF power level. Spectrometers have generally been designed to operate at a single frequency, selected as a compromise between resolution, sensitivity, and RF power requirements.

For single-frequency voltage magnification, classic resonant voltage step-up topologies are well-suited and commonly used. One such commonly utilized topology is described with reference to FIG. 1A. An RF power amplifier 10, which must approximate a voltage source (must have a very low output resistance), directly drives the base of resonator inductor 12. The high-voltage output is then taken from the other end of the inductor 12. The load at the inductor output is the capacitance exhibited by the multipole rod (or other configuration) assembly. The voltage magnification is achieved entirely through resonant rise (at resonance, the phase shift across the inductor is 90 degrees, or a quarter wave, corresponding to a voltage minima at the drive end and a voltage maxima at the other end). The voltage step-up is equal to the circuit Q (quality factor). The Q factor in this case includes all circuit losses, including those contributed by the load, such as resistive rods if those are used in the rod assembly. A high frequency signal source 14 provides the oscillaging input signal for RF power amplifier 10.

FIG. 1B shows a circuit diagram for facilitating an analysis of the RF performance of the FIG. 1A topology, with corresponding equations (ignoring losses) as follows:

$$F=1/(2\pi\sqrt{(LC_R)})$$

$$Z(s)=A[(S^2+B)/s]$$

$$A=1/L$$

$$B=1/LC_R$$

As those versed in the art of RF network and filter design will understand, Z(s) is the driving point impedance looking into the LC network, where s is the complex frequency variable. The driving point impedance goes to zero at the frequency indicated by B, which is also the frequency at which the voltage magnification peaks to infinity, in this case at $F=1/(2\pi\sqrt{(LC_R)})$. The s in the denominator of Z(s) denotes the pole at the origin caused by the load capacitance C, which goes to infinite impedance as the frequency goes to zero. In real-world circuits the components, especially inductors, exhibit loss. The effects of this are that, at resonance the driving point impedance reaches a minimum but does not go to zero, while the magnification peaks at a finite value.

A disadvantage of the resonator approaches above is that a given LC resonant circuit with one inductance and one capacitance as implemented in the prior art is only operable to step up the RF voltage efficiently at a single, fixed frequency. Operation at multiple frequencies, simultaneously or otherwise, is not possible unless those frequencies differ by only a tiny amount. Running the mass spectrometer efficiently at a significantly different frequency than that to which the resonator and oscillator are tuned was only accomplished by manual intervention, by switching the spectrometer power off (or at least putting the machine into some sort of stand-by mode), mechanically dismounting the quad driver or the LC resonant circuit assembly and replacing it with a different quad driver or LC resonant circuit assembly that operates at a different frequency, and then powering the spectrometer back up for operation.

Overview

Described herein is an arrangement for providing high voltage RF at multiple frequencies, for example to power an ion-manipulating structure such as a rod assembly of a mass spectrometer. The multiple frequencies can be provided simultaneously or non-simultaneously, whereby operation can be rapidly and efficiently switched between two or more different operating frequencies without any need for switching off power or removing and replacing components or assemblies. The use of two or more frequencies can allow efficient optimization of sensitivity (low frequency) or resolution (high frequency), or both in the case of simultaneous operation at multiple frequencies. In certain embodiments, the data from the two operating frequencies can be combined to provide both high resolution and high sensitivity in a given experiment. The ability to switch between multiple frequencies of operation, in quadrupole assemblies for example, allows the user to select the frequency yielding the optimum trade-offs between resolution, sensitivity, and RF power requirement for any given experiment.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

The following description is illustrative only and is not intended to be in any way limiting. Other embodiments will readily suggest themselves to those of ordinary skill in the art having the benefit of this disclosure. Reference will be made in detail to implementations of the example embodiments as illustrated in the accompanying drawings. The same reference indicators will be used to the extent possible throughout the drawings and the following description to refer to the same or like items.

In the description of example embodiments that follows, references to "one embodiment", "an embodiment", "an example embodiment", "certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the interest of clarity, not all of the routine features of the implementations described herein are shown and described. It will be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The term "exemplary" when used herein means "serving as an example, instance or illustration." Any embodiment described herein as "exemplary" is not necessarily to be construed as preferred or advantageous over other embodiments.

Figure 1A:
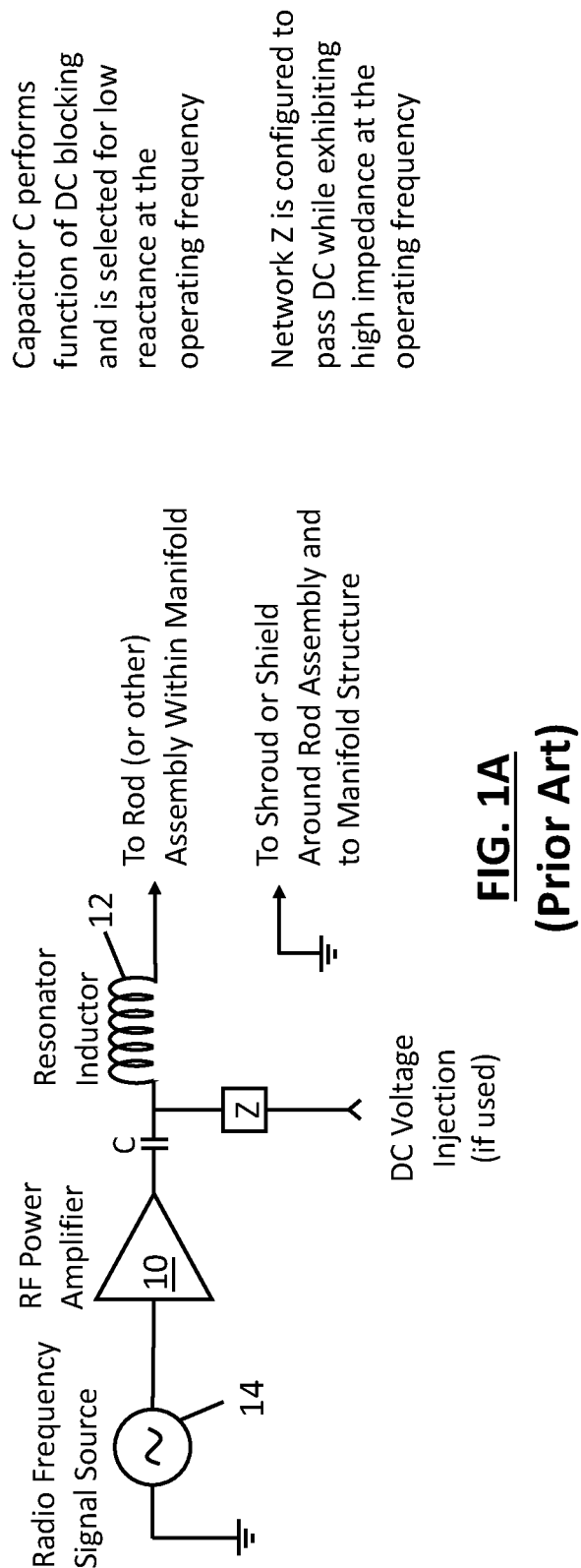
FIG. 1A is a schematic diagram illustrating conventional single-frequency voltage magnification.
Figure 1B:
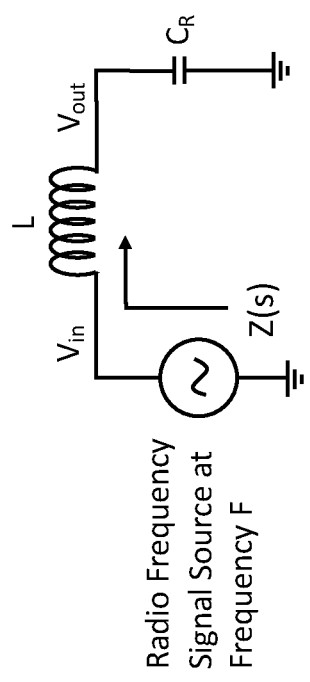
FIG. 1B shows a circuit diagram for facilitating an analysis of the RF performance of the FIG. 1A topology.
Figure 2:
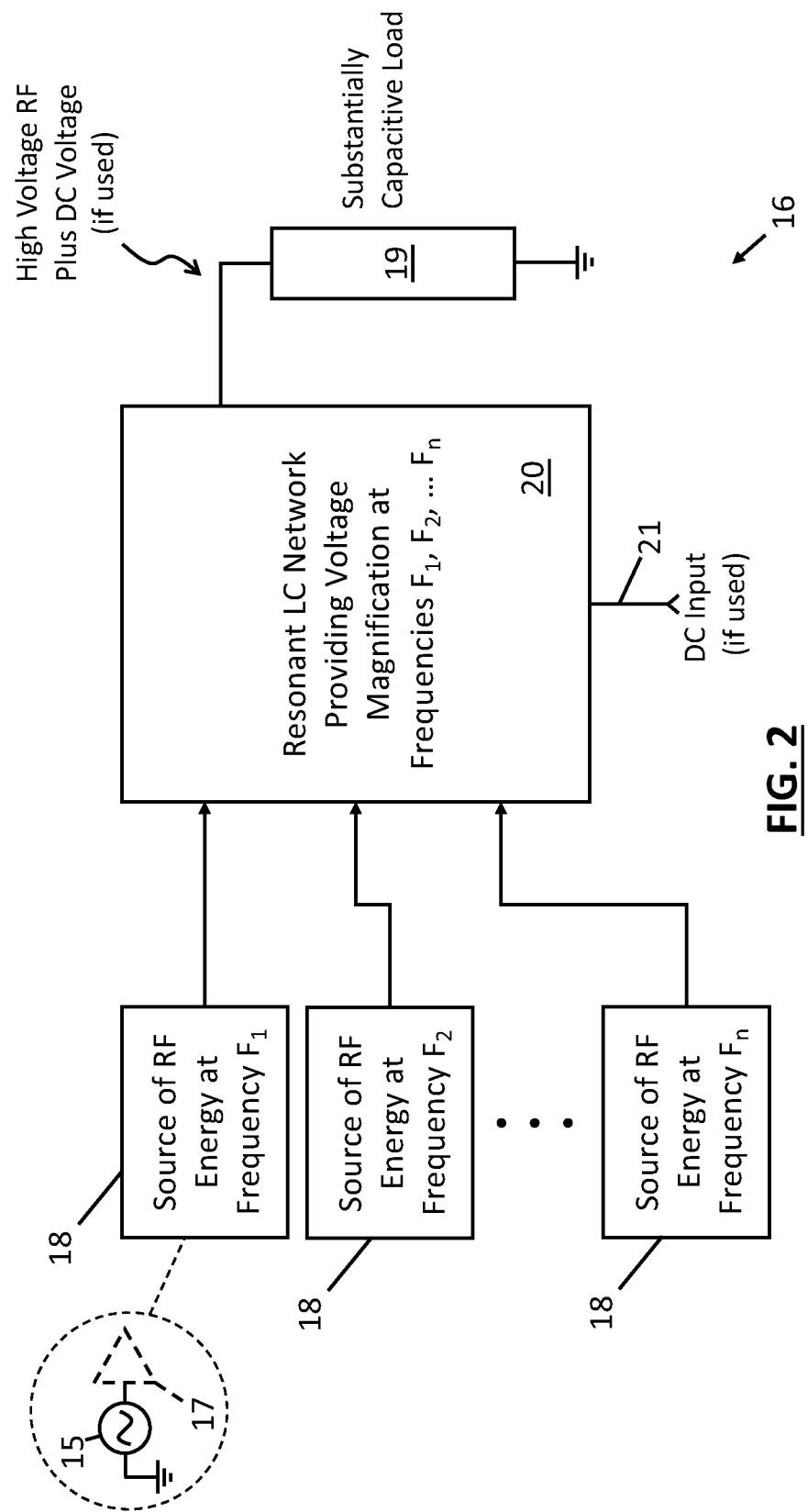
FIG. 2 is a block diagram of a system for providing RF power at multiple high frequencies to an instrument such as a mass spectrometer in accordance with certain embodiments.

FIG. 2 is a block diagram of a system 16 for providing RF power at multiple high frequencies to an instrument such as a mass spectrometer in accordance with certain embodiments. System 16 includes RF energy sources 18 that are coupled to a voltage magnification circuit, for example in the form of a resonant LC network 20. In certain embodiments, one or more of the RF energy sources 18 can comprise an individual oscillator (15) or RF synthesizer for generating an oscillating signal. Alternatively, one or more RF synthesizers can be used to generate multiple oscillating signals. Optionally, one or more of the RF energy sources 18 can include an RF power amplfier (17) for amplifying the oscillating signal before providing it to resonant LC network 20.

Resonant LC network 20 provides significant voltage magnification or step-up of the RF voltages from each of the RF energy sources 18. The output of resonant LC network 20 is high voltage RF energy for driving an ion-manipulating structure 19, which can be a rod assembly of a mass spectrometer and which presents a substantially capacitive load on the resonant LC network 20. The ion-manipulating structure, which for example can be a rod assembly such as a quadrupole, hexapole, octupole, and so on, can be selectively driven in this mannner at multiple frequencies, either simultaneously, or asynchronously.

Figure 3:
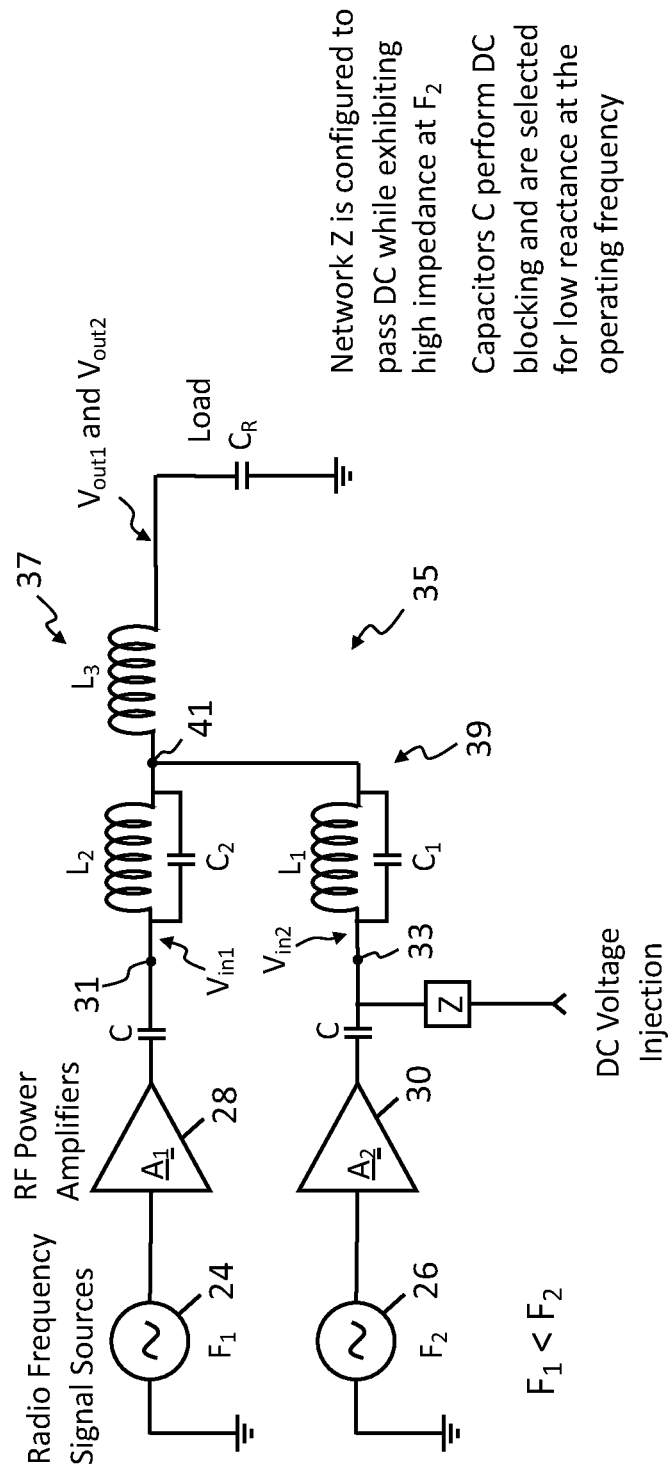
FIG. 3 is a schematic diagram of a multi-frequency RF power source for driving an ion-manipulating structure of an instrument such as a mass spectrometer in accordance with certain embodiments.

FIG. 3 is a schematic diagram of a multi-frequency RF power source 22 for driving an ion-manipulating structure (for example a rod assembly such as a quadrupole, hexapole, octupole) of an instrument such as a mass spectrometer in accordance with certain embodiments. First and second RF signal sources 24 and 26, respectively operating at frequencies $F_1$ and $F_2$, drive first and second RF power amplifiers 28 and 30. Signal sources 24 and 26 may be discrete oscillators or RF synthesizers, or they may be a single RF synthesizer generating signals at the two frequencies. The amplifiers 28 ($A_1$) and 30 ($A_2$) are RF power amplifiers each having a very low output impedance—that is, they approximate voltage sources. In certain embodiments, depending on the power level of the oscillating signal sources, RF power amplifiers 28 and 30 may not be necessary. For example, if RF signal sources 24 and 26 comprised high-power fundamental oscillator(s), there would be no need to boost their output, and the use of RF power amplifiers 28 and 30 could be eliminated.

In the arrangement of FIG. 3, amplifier $A_1$ produces an output voltage signal at frequency $F_1$ and amplifier $A_2$ produces an output voltage signal at frequency $F_2$. The two output voltage signals are provided to inputs 31 and 33 of a step-up circuit 35. In certain embodiments, step-up circuit 35 comprises an LC network having a first LC resonant nertwork 37 and a second LC resonant network 39. First LC resonant network 37 comprises series-connected inductors $L_2$ and $L_3$ coupled to the first input 31, and a capacitor $C_2$ connected across inductor L2. Second LC resonant network 39 comprises series-connected inductors $L_1$ and $L_3$ coupled to the second input 33, and a capacitor $C_1$ connected across inductor $L_1$. Inductors $L_1$ and $L_2$ are connected together at node 41. Additional capacitors C disposed at the outputs of amplifiers $A_1$ and $A_2$ serve to block DC voltages. Capacitors C are selected to have very low reactances at $F_1$ and $F_2$ such that they need not be considered in an RF analysis of circuit operation. Similarly, block Z is a network with a high impedance at $F_2$ and need not be considered in an RF circuit analysis.

Inductor $L_1$ and capacitor $C_1$ together form a first parallel resonant LC trap, and inductor $L_2$ and capacitor $C_2$ together form a second parallel resonant LC trap. For the first LC trap, the component values are chosen such that $F_1 = 1/2\pi\sqrt{L_1 C_1}$. Assuming lossless components, this $L_1 C_1$ trap will exhibit an infinite impedance at $F_1$. Thus, when analyzing circuit operation at $F_1$, the $L_1C_1$ trap and everything upstream of it in the signal path need not be considered.

For the second LC trap, the component choices and relationships are analogously selected for $L_2$, $C_2$, and $F_2$—that is, $F_2=1/2\pi\sqrt{L_2C_2}$, and when analyzing circuit operation at $F_2$, the $L_2C_2$ trap will exhibit infinite impedance and therefore it and all components upstream of it need not be considered.

The operation of the step-up circuit 35 will be analyzed with reference to FIGS. 3A-3D, with the assumption that frequency $F_2$ is higher than frequency $F_1$ and that the losses in the inductors are small—that is, the inductors have high Q values.

Figure 3A:
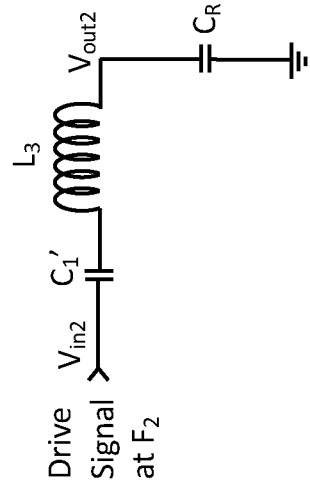
FIGS. 3A-3D are schematic diagrams of circuits used to facilitate analysis of variations on the described topologies.
Figure 3D:
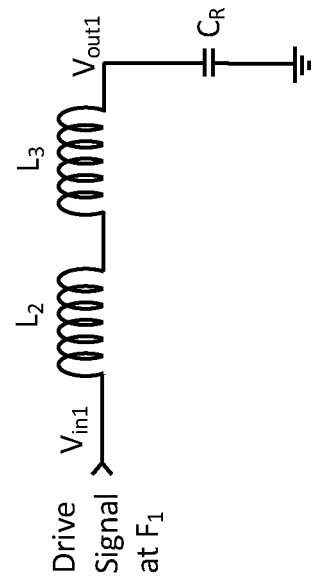

At frequencies below $F_2$ the $L_2C_2$ trap will appear inductive; it will look inductive at $F_1$. That is, as illustrated in FIG. 3A, at frequency $F_1$, the two trap components $L_2C_2$ together will act as a single inductor that can be referred to as $L_2'$. The value of $L_2'$ will be a function of frequency. Very close to but just below $F_2$ the value of $L_2'$ will be very large, while far below $F_2$, the value of $L_2'$ will be small.

The values of $L_2$ and $L_3$ are chosen such that at frequency $F_1$ the equation $F_1=1/2\pi\phi(L_2'+L_3)C_R$ is satisfied. Then the voltage step-up from $V_{in1}$ to $V_{out1}$ will be approximately equal to the overall circuit Q—that is, the Q of inductance $L_2'+L_3$, plus the loss effect of $L_1$, assuming the various capacitors are essentially lossless.

Figure 3B:
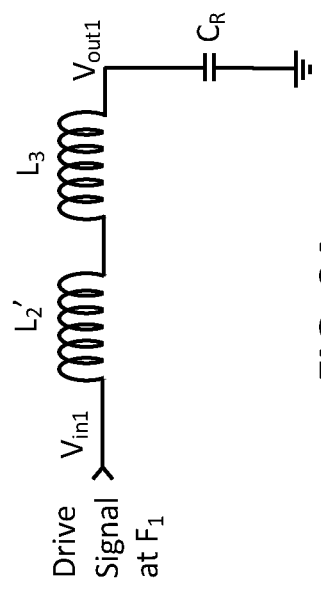

With reference to FIG. 3B, at frequencies above $F_1$ the $L_1C_1$ trap will look capacitive (so it will look capacitive at $F_2$). That is, the two $L_1C_1$ trap components together will act as a single capacitor that can be referred to as $C_1'$. The value of $C_1'$ will be a function of frequency. Very close to but just above $F_1$ the value of $C_1'$ will be very small, while far above $F_1$, the value of $C_1'$ will be large.

The value of $C_1$ is chosen such that at $F_2$ the equation $F_2=1/2\pi\phi L_3(C_1'C_R/(C_1'+C_R))$ is satisfied. Then the voltage step-up from $V_{in2}$ to $V_{out2}$ will be approximately equal to $C_1'/(C_1'+C_R)$ times the circuit Q at $F_2$. Similarly to the analysis at $F_1$ and $V_{in1}$, the circuit Q at $F_2$ will be established primarily by the losses in the three inductors $L_1$-$L_3$.

The capacitances $C_1'$ and $C_R$ are in series and form a voltage divider. Thus, for efficient high voltage step-up at $F_2$ it is desirable to have the ratio $C_1'/C_R$ be as high as possible.

Figure 3C:
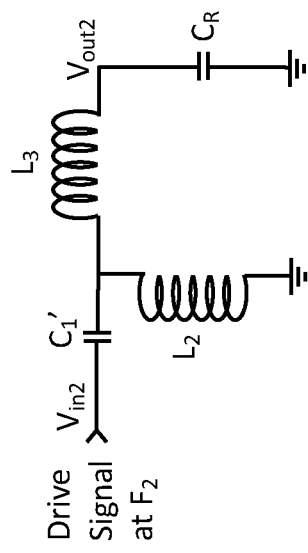

The circuit shown in FIG. 3 can be modified to replace one of the LC traps with an inductor (if, for example $C_2$ is eliminated). The equivalent RF circuit for analysis is then as seen in FIG. 3C. Capacitor $C_1'$ is the effective capacitance exhibited by the $L_1C_1$ trap at $F_2$ as previously explained. The circuit for analysis at $F_1$ drive signal becomes that shown in FIG. 3D.

The equation for Z(s) in FIG. 3C is:

$$Z(S) = A\left[\frac{(S^2+B)(S^2+C)}{S(S^2+D)}\right] \quad (2)$$

The general form of this equation after factoring is:

$$Z(S) = \frac{L_2L_3}{L_2+L_3}\left[\frac{S^4+S^2\left(\frac{L_2+L_3}{C_1'L_2L_3}+\frac{1}{C_RL_3}\right)+\frac{1}{C_1'C_RL_2L_3}}{S\left(S^2+\frac{1}{C_R(L_2+L_3)}\right)}\right] \quad (3)$$

in which A through D are constants. The equation shows that the voltage magnification peaks at two distinct frequencies indicated by B and C. There is also a frequency indicated by D at which the transmission through the network goes to zero (assuming no losses).

Those versed in the art will appreciate that various other similar modifications of the FIG. 3 topology are possible in which one or more resonant LC traps are connected in conjunction with one or more additional LC components to form a network that supports resonant voltage step-up from multiple oscillating signal sources operating at different frequencies to a single output node. Thus it should be noted that the achievement of a multi-frequency output such as $V_{out1}$ and $V_{out2}$ as described herein does not require a dedicated trap for each of the multi-frequency input signals. An underlying principle of operation of the described arrangement is that each input (for example 31 or 33) is configured to operate efficiently at one frequency, which frequency is different from the frequencies at which any other input is configured to efficiently operate. An important function of the LC topology as described herein is to isolate each input at its operating frequency from any other input so that the sources of oscillation at those other inputs do not short out or unduly attenuate the signal at the input of interest. The step-up circuit such as circuit 35 generates magnified RF voltage signals based on the received RF voltage signals at the circuit inputs 31, 33. Thus in certain embodiments the LC network of the step-up circuit is provided with one or more LC traps, and at least one of an inductor or a capacitor, and serves to isolate the plurality inputs from one another while preserving a voltage magnification from each input to a common output at each of the corresponding frequencies.

The FIG. 3 topology may be extended to work at more than two frequencies. For three frequencies, $F_1$, $F_2$, and $F_3$, each of the three corresponding amplifiers must be followed by two separate parallel LC traps in series with each other. The first channel must include LC traps at $F_2$ and $F_3$, the second channel must include LC traps at $F_1$ and $F_3$, and the third channel must include LC traps at $F_1$ and $F_2$. For a given number of frequencies, N, the total number of LC traps required is N(N−1).

Although FIG. 3 shows a circuit with a single output to a capacitive load (such as a multi-pole rod assembly or some other configuration) with respect to ground, it is also possible for the resonant drive system to be differential with two high-voltage RF outputs that are equal in amplitude and frequency but differ in phase from each other by 180 degrees. In certain embodiments, such differential drive circuits are used to drive symmetrical rod assemblies.

The resonator networks described herein do not necessarily dissipate significant amounts of power (because, in certain embodiments, the various impedance elements in them are mostly reactive rather than resistive, and only resistive elements dissipate power). However, in certain embodiments, the networks generate higher levels of circulating RF current in one or more reactive circuit elements than do single-frequency resonators. As a result, the product of the RF voltage magnitude and the RF current magnitude (this product is typically referred to as VA) that the amplifier is required to produce is higher than with single-frequency resonators. When the voltage and current waveforms in the load that an amplifier is driving are in phase with each other, the power dissipated in the load in watts equals the VA. When they are 90 degrees out of phase the power in the load is zero no matter what the VA is. For cases other than ones in which the voltage and current are either in phase alignment or in phase quadrature, the dissipated power magnitude will be non-zero but less than the VA. The voltage swing capability and the current output capability of the amplifier must be based upon the VA that must be supported however so, even in cases where very little power is dissipated in the load, a large power amplifier is required if the VA is high. The same applies to the capacity of the DC power supply supporting the amplifier.

In certain embodiments, the resonator inductors may be either air core or iron-powder core. In some cases other core materials such as ferrite, metal, laminated metal, or more exotic materials or combinations of materials may be advantageous. Similarly, winding shape may vary depending on the application (solenoid, toroid, flat spiral, or others).

In certain embodiments, modest amounts of mutual inductance between the multiple inductances in the resonator assembly is not necessarily detrimental to operation and in fact can be advantageous because it allows the inductors to share coil formers and/or cores, which saves space and generally reduces cost. It also causes changes in the exact circuit element values required, which means, in certain embodiments, equation (2) is less precisely applicable (notwithstanding that the equation does not include loss terms and so is, in all cases, not precise in describing the real-world performance anyway).

Figure 4:
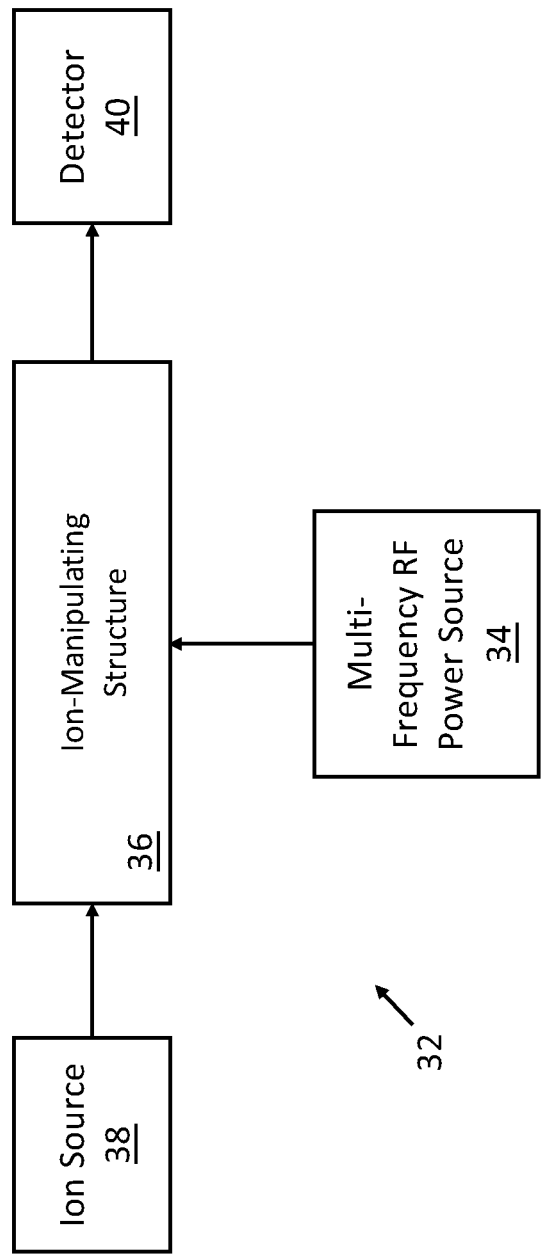
FIG. 4 is a block diagram of an instrument using a multi-frequency RF power source in accordance with certain embodiments.

FIG. 4 is a block diagram of an instrument 32 using a multi-frequency RF power source 34, such as power source 22 above, in accordance with certain embodiments. The multi-frequency RF power source 34 is used to drive an ion-manipulating structure 36, which can be a rod assembly such as a quadrupole, hexapole, octupole, and so on, as described herein. More generally, any structure that requires a multi-frequency RF power source, for example to influence passing ions, may benefit from the multi-frequency RF power source 34. An ion source 38 delivers ions to the ion-manipulating structure 36, and a detector 40 senses one or more parameters of interest, for example those relating to the presence, mass, charge, atomic configuration, trajectory, time of flight, or other characterisitics of the ions. As explained above, multi-frequency RF power source 34 may used to provide RF power at two or more frequencies simultaneously or in sequence. In certain embodiments, the instrument 44 may be a mass spectrometer, mass analyzer, time-of-flight (TOF) analyzer, or the like.

Ion source 38 may be an electron impact (EI) source, an electrospray ionization (ESI) source, a chemical ionization (CI) source, a photoionization (PI) source, a matrix assisted laser desorption/ionization (MALDI) source, an inductively coupled plasma (ICP) source, a multi-mode source (such as a combination of ESI and CI), or any other ion source for mass spectrometers.

In certain embodiments, advantages can be realized in hexapole or octupole cell operation if one of the rod sets is driven with two frequencies simultaneously using schemes as described herein. There may also be advantages in using more than two frequencies or in driving more than one rod set with multiple frequencies in the manner described. In certain embodiments, the use of multiple frequencies in hexapole and octupole cells can eliminate the requirement for the use of resistive rods and allow less costly conductive metal rods to be used instead. The described circuit topologies may also be broadly applied to any application which requires two or more frequencies of high-voltage sine waves to be applied to a common capacitive load, or to a resistive load with the addition of a resonating capacitance.

In certain embodiments, a DC input 21 (FIG. 2) can be applied to the LC network, to be manifested in its output to the ion-manipulating structure, for example the rod assembly, without disturbing the circuit operation at RF. For example, when the rod assembly is a quadrupole arrangement, a DC voltage may be applied across the quadrupole. The rods in such an arrangement may be connected together in pairs, or rod sets, and the voltage, which may be designated V, is applied from one rod set to the other rod set. The voltage need not be referenced to ground, nor to the manifold case of the rod assembly, in any way. In practice, two separate DC voltages of magnitude V/2 may be produced, one of which is positive with respect to ground and the other of which is negative with respect to ground. Referring to these voltages as U+ and U− (or sometimes Ua and Ub), U+ is applied to one set of two rods and U− is applied to the other set of two rods.

In hexapole rod assembly systems, by contrast, a fairly high DC voltage is applied to all six rods with respect to ground (which includes the manifold case and sometimes a shroud surrounding the hexapole). In some cases, it is also desirable to have a slight voltage gradient (in the range of 0 to 10 volts for instance) along the lengths of the rods. When such a gradient is desired, rods that are resistive (as opposed to rods that are near perfect DC conductors) may be employed. In the case with resistive rods and a voltage gradient, the voltage applied to one end of the rods will differ slightly from the voltage applied to the other ends, but the rodes will still all be of the same polarity (for example +200 and +205). In addition, the DC voltage applied to one set of three rods will not differ from the DC voltage applied to the other set of three rods.

Exemplary Embodiments

In addition to the embodiments described elsewhere in this disclosure, exemplary embodiments of the present invention include, without being limited to, the following Embodiments:

1. A circuit for providing high-voltage radio-frequency (RF) energy to an instrument at multiple frequencies, comprising:
   a plurality of inputs each configured to receive an RF voltage signal oscillating at a corresponding frequency; and
   a step-up circuit for generating magnified RF voltage signals based on the received RF voltage signals, the step-up circuit comprising an LC network operable to isolate the RF voltage signals at the plurality inputs from one another while preserving a voltage magnification from each input to a common output at each of the corresponding frequencies.

2. The circuit of Embodiment 1, wherein the LC network comprises one or more LC traps and at least one of an inductor or a capacitor.

3. The circuit of Embodiment 1 or 2, wherein the LC network comprises first and second LC traps.

4. The circuit of Embodiment 3, wherein each LC trap comprises a parallel connection of a resonator and a capacitor.

5. The circuit of Embodiment 3, wherein the first LC trap comprises a parallel connection of a resonator and a capacitor and the second LC trap comprises an inductor.

6. The circuit of any of the preceding Embodiments, wherein the step-up circuit comprises:
   a first LC resonator network operable to resonate at a first frequency $F_1$ and having a first LC trap that exhibits substantially infinite impedance at a second frequency $F_2$, and a second LC resonator network operable to resonate at the second frequency $F_2$ and having a second LC trap that exhibits substantially infinite impedance at the first frequency $F_1$.

7. The circuit of Embodiment 6, wherein $F_1$ is less than $F_2$, and the first LC trap has an inductor $L_1$ and a capacitor $C_1$ whose values satisfy $F_1=1/2\pi\sqrt{L_1C_1}$.

8. The circuit of any of the preceding Embodiments, wherein the plurality of inputs comprises more than two inputs, each input configured to receive an RF voltage signal oscillating at a corresponding frequency.

9. A power source for providing high-voltage radio-frequency (RF) energy to an instrument at multiple frequencies, comprising:
    first and second RF energy sources;
    a circuit in accordance with any one of the preceding Embodiments, wherein the first RF energy source provides an RF signal at a first input, and the second RF energy source provides the RF signal at a second input.

10. The power source of any one of Embodiments 2-9, wherein the first and second RF energy sources comprise first and second RF signal sources coupled to corresponding first and second RF amplifiers.

11. An instrument comprising:
    an ion-manipulating structure;
    an ion source for providing ions to the ion-manipulating structure;
    a detector coupled to the ion-mainpulating structure for detecting ions;
    a power source in accordance with Embodiment 9 or 10 for providing high-voltage RF energy to the ion-manipulating structure.

12. The instrument of Embodiment 11, wherein the instrument is a mass spectrometer.

13. The instrument of Embodiment 11 or 12, wherein the ion-manipulating structure comprises a multi-rod assembly.

14. The instrument of Embodiment 13, wherein the multi-rod assembly is a quadrupole.

15. The instrument of Embodiment 13, wherein the multi-rod assembly is a hexapole or octupole.

16. The instrument of Embodiment 11 or 12, wherein the ion-manipulating structure comprises a stack of ring electrodes.

17. The instrument of any of the preceding Embodiments, wherein the instrument comprises a time-of-flight mass analyzer.

18. A method for generating high-voltage radio-frequency (RF) energy for an instrument at multiple frequencies, comprising:
    providing an RF voltage signal at each of a plurality of inputs, each RF voltage signal oscillating at a corresponding frequency; and
    generating magnified RF voltage signals, based on the provided RF voltage signals, using a step-up circuit having an LC network operable to isolate the RF voltage signals at the plurality inputs from one another while preserving a voltage magnification from each input to a common output at each of the corresponding frequencies.

19. The method of Embodiment 18, wherein the LC network comprises one or more LC traps and at least one of an inductor or a capacitor.

20. The circuit of Embodiment 18, wherein the LC network comprises first and second LC traps.

21. The circuit of Embodiment 20, wherein each LC trap comprises a parallel connection of a resonator and a capacitor.

22. The circuit of Embodiment 20, wherein the first LC trap comprises a parallel connection of a resonator and a capacitor and the second LC trap comprises an inductor.

23. The method of any of Embodiments 18-22, wherein the step-up circuit comprises:
    a first LC resonator network operable to resonate at a first frequency $F_1$ and having a first LC trap that exhibits substantially infinite impedance at a second frequency $F_2$, and
    a second LC resonator network operable to resonate at the second frequency $F_2$ and having a second LC trap that exhibits substantially infinite impedance at the first frequency $F_1$.

24. The method of Embodiment 23, wherein F1 is less than F2, and the first LC trap has an inductor L1 and a capacitor C1 whose values satisfy $F1=1/2\pi\sqrt{L1C1}$.

25. The method of any of Embodiments 18-24, further comprising delivering the RF voltage signal at each of a plurality of inputs using first and second RF signal sources coupled to corresponding first and second RF amplifiers.

26. The method of any of Embodiments 18-25, wherein the plurality of inputs comprises more than two inputs, each input configured to receive an RF voltage signal oscillating at a corresponding frequency.

27. The method of any of Embodiments 18-26, wherein the instrument is a mass spectrometer.

28. The method of any of Embodiments 18-26, wherein the instrument is a time-of-flight analyzer.

29. The method of any of Embodiments 18-26, wherein the instrument is a quadrupole.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted based on the foregoing description.

I claim:

1. A circuit for providing high-voltage radio-frequency (RF) energy to an instrument at multiple frequencies, comprising:
    a plurality of inputs each configured to receive an RF voltage signal oscillating at a corresponding frequency; and
    a step-up circuit to generate magnified RF voltage signals based on the received RF voltage signals, the step-up circuit comprising an LC network.

2. The circuit of claim 1, wherein the step-up circuit comprises:
    a first LC resonator network operable to resonate at a first frequency $F_1$ and having a first LC trap that exhibits substantially infinite impedance at a second frequency $F_2$, and
    a second LC resonator network operable to resonate at the second frequency $F_2$ and having a second LC trap that exhibits substantially infinite impedance at the first frequency $F_1$.

3. The circuit of claim 2, wherein $F_1$ is less than $F_2$, and the first LC trap has an inductor $L_1$ and a capacitor $C_1$ whose values satisfy $F_1=1/2\pi\sqrt{L_1C_1}$.

4. The circuit of claim 1, wherein the plurality of inputs comprises more than two inputs, each input configured to receive an RF voltage signal oscillating at a corresponding frequency.

5. The circuit of claim 1, wherein the LC network comprises one or more LC traps and at least one of an inductor or a capacitor.

6. The circuit of claim 1, wherein the LC network comprises first and second LC traps.

7. The circuit of claim 6, wherein each LC trap comprises a parallel connection of a resonator and a capacitor.

8. The circuit of claim 6, wherein the first LC trap comprises a parallel connection of a resonator and a capacitor and the second LC trap comprises an inductor.

9. An instrument comprising:
an ion-manipulating structure;
an ion source to provide ions to the ion-manipulating structure;
a detector coupled to the ion-mainpulating structure to detect ions; and
a power source to provide high-voltage RF energy to the ion-manipulating structure, the power source including:
first and second RF energy sources configured to provide RF voltage signals at first and second corresponding frequencies, respectively; and
a step-up circuit having first and second inputs respectively coupled to the first and second RF energy sources.

10. The instrument of claim 9, wherein the instrument is a mass spectrometer.

11. The instrument of claim 9, wherein the ion-manipulating structure comprises a multi-rod assembly.

12. The instrument of claim 11, wherein the multi-rod assembly is a quadrupole.

13. The instrument of claim 11, wherein the multi-rod assembly is a hexapole or octupole.

14. The instrument of claim 9, wherein the ion-manipulating structure comprises a stack of ring electrodes.

15. The instrument of claim 9, wherein the instrument comprises a time-of-flight mass analyzer.

16. A method for generating high-voltage radio-frequency (RF) energy for an instrument at multiple frequencies, comprising:
providing an RF voltage signal at each of a plurality of inputs, each RF voltage signal oscillating at a corresponding frequency; and
generating magnified RF voltage signals, based on the provided RF voltage signals, using a step-up circuit having an LC network.

17. The method of claim 16, wherein the step-up circuit comprises:
a first LC resonator network operable to resonate at a first frequency $F_1$ and having a first LC trap that exhibits substantially infinite impedance at a second frequency $F_2$, and
a second LC resonator network operable to resonate at the second frequency $F_2$ and having a second LC trap that exhibits substantially infinite impedance at the first frequency $F_1$.

18. The method of claim 16, wherein the plurality of inputs comprises more than two inputs, each input configured to receive an RF voltage signal oscillating at a corresponding frequency.

19. The method of claim 16, wherein the instrument is a mass spectrometer.

20. The method of claim 16, wherein the instrument is a time-of-flight analyzer.

* * * * *